United States Patent
Hari Prasad et al.

(10) Patent No.: US 11,349,732 B1
(45) Date of Patent: May 31, 2022

(54) DETECTION OF ANOMALIES IN A NETWORK

(71) Applicant: Hewlett Packard Enterprise Development LP, Houston, TX (US)

(72) Inventors: Srinidhi Hari Prasad, Karnatka (IN); Madhusoodhana Chari Sesha, Karnataka (IN); Tamil Esai Somu, Karnataka (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/237,606

(22) Filed: Apr. 22, 2021

(51) Int. Cl.
| H04L 43/022 | (2022.01) |
| G06N 20/00 | (2019.01) |
| H03M 7/30 | (2006.01) |
| H04L 47/2441 | (2022.01) |
| H04L 43/10 | (2022.01) |

(52) U.S. Cl.
CPC .......... *H04L 43/022* (2013.01); *G06N 20/00* (2019.01); *H03M 7/3088* (2013.01); *H04L 43/10* (2013.01); *H04L 47/2441* (2013.01)

(58) Field of Classification Search
CPC ... H04L 43/022; H04L 43/10; H04L 47/2441; G06N 20/00; H03M 7/3088
USPC ......................................................... 709/224
See application file for complete search history.

(56) References Cited

U.S. PATENT DOCUMENTS

| 8,042,184 | B1 * | 10/2011 | Batenin | H04L 63/145 |
| | | | | 711/147 |
| 8,042,185 | B1 * | 10/2011 | Mu | G06F 16/11 |
| | | | | 713/151 |
| 8,855,301 | B2 * | 10/2014 | McGrew | H04L 63/0435 |
| | | | | 713/168 |
| 8,983,866 | B2 * | 3/2015 | Ravisankar | G06Q 40/04 |
| | | | | 709/200 |
| 2007/0162957 | A1 * | 7/2007 | Bartels | G05B 15/02 |
| | | | | 726/2 |

(Continued)

OTHER PUBLICATIONS

"LZW Data Compression", available online at <http://www2.cs.duke.edu/csed/curious/compression/lzw.html>, 2002, 5 pages.

(Continued)

*Primary Examiner* — Tauqir Hussain
(74) *Attorney, Agent, or Firm* — Hewlett Packard Enterprise Patent Department (57) ABSTRACT

Examples relate to detection of anomalies in a network. Some examples determine a dictionary including a set of keys for a set of packet length values for a selected sequence of packets associated with a traffic flow over a network, each key represents a combination of two or more successive packet length values from the set of packet length values. An aggregated set of statistical features is determined based in part on the set of statistical features using a machine learning algorithm. Upon determining another set of packet length values for another selected sequence of packets, another set of statistical features for the other set of packet length values is determined. The other set of statistical features is compared with the aggregated set of statistical features. Based on the comparison, an indication that an anomaly has occurred in the traffic flow is transmitted to an administrator.

18 Claims, 4 Drawing Sheets

(56) References Cited

U.S. PATENT DOCUMENTS

| | | | | |
|---|---|---|---|---|
| 2008/0109889 | A1* | 5/2008 | Bartels | H04L 63/0428 700/9 |
| 2009/0138972 | A1* | 5/2009 | Scales | H04L 63/1441 726/24 |
| 2010/0153785 | A1* | 6/2010 | Keromytis | G06F 11/3688 714/38.11 |
| 2010/0313270 | A1* | 12/2010 | Kim | H04W 52/0264 726/24 |
| 2011/0055047 | A1* | 3/2011 | Fox | H04L 69/14 715/224 |
| 2013/0262703 | A1* | 10/2013 | Dong | H04L 47/38 709/247 |
| 2015/0032850 | A1* | 1/2015 | Talyansky | H04L 67/2842 709/218 |
| 2017/0026391 | A1* | 1/2017 | Abu-Nimeh | G06F 16/24578 |
| 2020/0314138 | A1* | 10/2020 | Petry | H04L 63/10 |
| 2021/0168083 | A1* | 6/2021 | Somu | H04L 43/022 |
| 2021/0194832 | A1* | 6/2021 | Keszei | H04L 49/9084 |
| 2021/0294974 | A1* | 9/2021 | Gao | G06F 40/166 |

OTHER PUBLICATIONS

Arista, "Leveraging EOS and sFlow for Advanced Network Visibility", White Paper, 2016, 6 pages.
Aruba, "Aruba Networks Analytics Engine", Solution Overview, 2019, 5 pages.
Keysight Technologies, "IxNetwork", available online at <https://www.ixiacom.com/products/ixnetwork>, 2021, 8 pages.
McNickle, Michelle, "OVSDB (Open vSwitch Database ManagementProtocol)", Tech Target, 2013, 4 pages.
Sflow, Traffic Monitoring using sFlow(registered), 2003, 5 pages.
Sivanathan et al., "Characterizing and Classifying IoT Traffic in Smart Cities and Campuses", IEEE Conference on Computer Communications Workshops (Infocom Wkshps), 2017, 6 pages.

\* cited by examiner

DETECTION OF ANOMALIES IN A NETWORK

BACKGROUND

A network, also referred to as a computer network or a data network, is a digital communication network which allows nodes (e.g., computing devices, network infrastructure devices, etc.) to share resources. In a network, nodes exchange data with each other using connections (e.g., data links) between nodes. These connections can be established over cable media such as wires or optic cables, or wireless media such as Wi-Fi. Managing a network includes various rules and procedures to ensure traffic optimization, security and good end user experience. In this regard, network visibility offers benefits in improving network management and security.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, in which.

DETAILED DESCRIPTION

Network visibility refers to being aware of traffic moving through a network. Network visibility enables network administrators or automated processes to keep a constant eye on network traffic, and monitor applications, network performance, and analytics. Network visibility not only helps in improving security by identifying unknown or suspicious traffic, but also helps in identifying trends early on and scale the network. However, with the rapid growth of Internet of Things (IoT) devices and immense variation in traffic trends, detecting anomalies in the traffic trends is a challenging issue. With varied network deployments, conventional detection methods may not be reliable. For example, network monitoring tools like TCP stat gives only the state of packet length for all packets and network monitoring methods like Deep Packet Inspection scans an entire packet stream which requires huge computational power to process the traffic and also would not work on the encrypted traffic. Also, with scaling networks both in port bandwidth and port density it becomes difficult to sample the traffic for external monitoring.

The present disclosure provides techniques for detecting an anomaly, in a network, that may be used to identify any malicious activity or any change in a trend of network traffic. An anomaly may refer to traffic in a network that deviates from what is expected to be observed by a network infrastructure device in the network in a period of time. An anomaly can be detected by identifying any change in a trend of network traffic that is expected to be observed by a network infrastructure device in a period of time in the network. A trend of network traffic may be determined based on statistical properties and/or attributes. As network traffic varies over time, the trend may vary during certain times of day, week or month. Knowing a trend of network traffic in a period of time may help in identifying any change in the trend of the network traffic in that period of time and thereby detect an anomaly in the network.

The disclosed techniques improve the technology for determining trends of network traffic in a network. The disclosed techniques utilize statistical features of traffic flows for determining trends of network traffic. The statistical features are based on the packet length values of the packets observed by a network infrastructure device in the network. For example, the disclosed techniques generate statistical features for multiple sets of packet length values and utilize an unsupervised machine learning algorithm to determine trends of the network traffic. Because the disclosed techniques utilize statistical features generated based on packet length values and not the packet length values, it allows determining trends in the network traffic based on the characteristics of the network traffic without the need to perform deep analysis of packet length values (e.g., repetition of a packet having a packet length value in the network traffic). In this manner, the disclosed techniques provide improvements in determining trends of network traffic and detecting any anomalies in the network traffic.

In an example consistent with this disclosure, a detection system determines a set of packet length values for a selected sequence of packets associated with a traffic flow in a network. The detected system generates a dictionary including a set of keys based on the set of packet length values and determines a set of statistical features for the dictionary. The dictionary may be generated using Lempel-Ziv-Welch (LZW) compression algorithm. The set of statistical features can then be utilized for determining an aggregated set of statistical features using a machine learning algorithm. When another set of packet length values for another selected sequence of packets associated with the traffic flow is determined, the detection system determines another set of statistical features for the other set of packet length values and compare them with the aggregated set of statistical features. Based on the comparison of sets of statistical features, the detection system transmits, to an administrator, an indication that an anomaly has occurred in the traffic flow.

Figure 1:
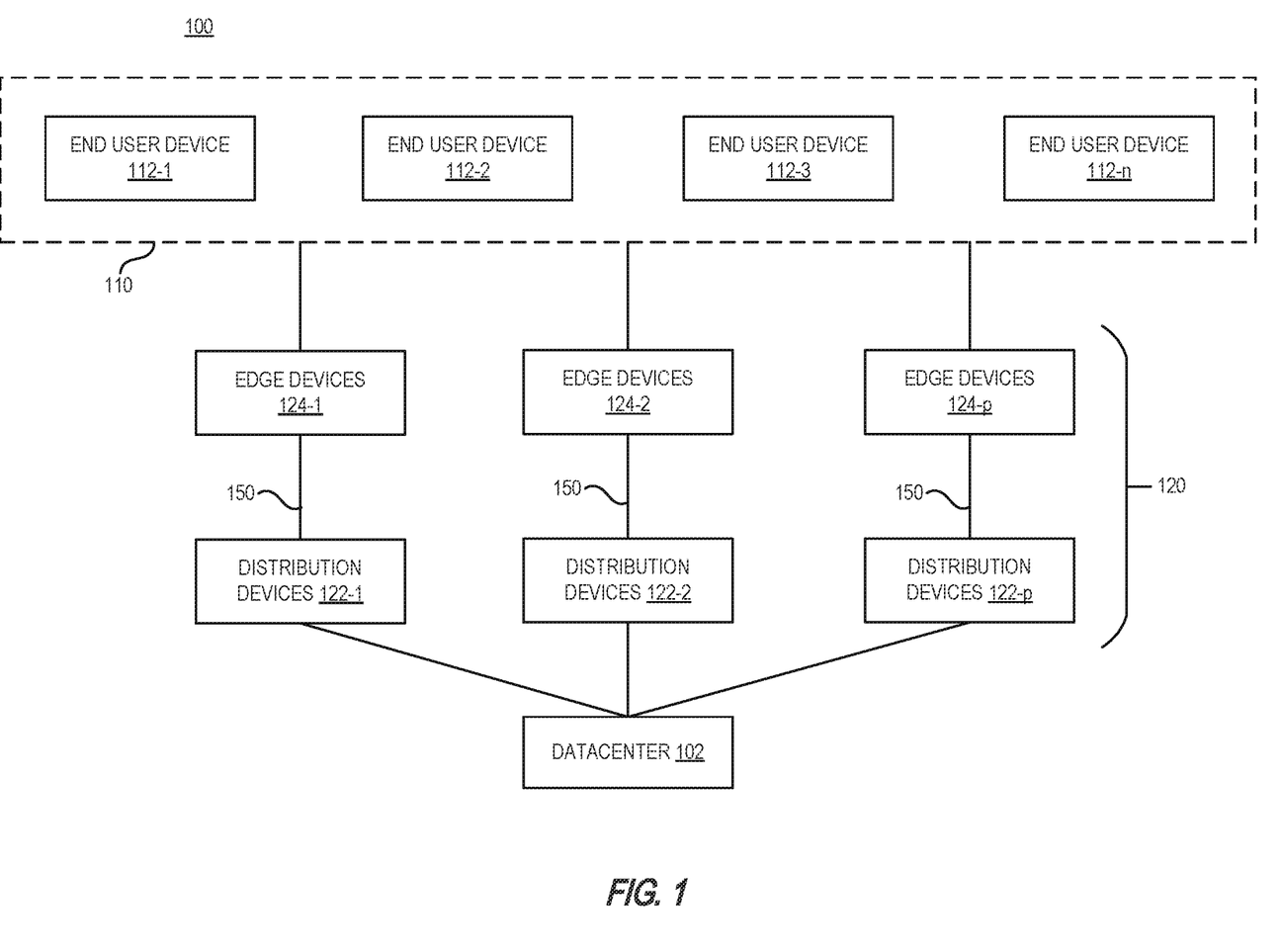
FIG. 1 illustrates an example architecture including network infrastructure devices in a network.

A traffic flow is a sequence of packets that have some field values in common. These common field values can include source IP address, destination IP address, source port, destination port, and IP protocol type (referred to as the "5-tuple"), FIG. 1 illustrates an example architecture of a network 100 including a datacenter 102 that includes computing devices 110 and network infrastructure devices 120. Although depicted as a single entity in FIG. 1, the datacenter 102 may comprise a plurality of geographically distributed computing devices configured to provide the core functionality for the network 100 implementing the computing devices. In some examples, the datacenter 102 may provide cloud-based services to the computing devices 110. The network 100 is provided for illustrative purposes only and should not be interpreted as limiting the scope of the technology only to the depicted network topology. The technology disclosed herein is agnostic to the network topology implemented. A person of ordinary skill in the art would understand that the technology disclosed herein is applicable within any communications network regardless of the network topology implemented.

The network 100 can include, for example, a local area network (LAN), a Wireless Local Area Network (WAN), a Metropolitan Area Network (MAN), a Storage Area Network (SAN), or a Campus Area Network (CAN). Further, the network 100 may be a public network (such as the Internet) or a private network (for instance, an intranet).

The computing devices 110 may create network traffic within the datacenter 102 by sending and receiving data via the network 100. The network infrastructure devices 120 may observe the network traffic within the network 100, such as by receiving the data sent and received by the computing devices 110 as they perform their functions of network switching and/or network routing. Data may flow between the computing devices 110 and the datacenter 102 through the network infrastructure devices 120.

A network infrastructure device 120 may be any suitable physical or virtual device with routing or switching functions. Examples of a network infrastructure device 120 may include a router, switch, access point (e.g., WiFi access point), gateway, controller, network orchestrator or the like.

The computing devices 110 may include end user devices 112-1 to 112-n (collectively, "the end user devices 112"). Examples of the end user devices 112 may include, but are not limited to, desktop computers, mobile computers, tablet computers (e.g., including e-book readers), mobile devices (e.g., a smartphone or PDA), set top boxes (e.g., for a television), video game consoles, or any other devices having appropriate processing circuitry, memory, and communications capabilities to connect to the network 150 and to send and receive data via the network 100. Other examples may include one or more Internet of Things (IoT) devices, such as connected appliances (e.g., smart refrigerators, smart watches, smart laundry machines, etc.), connected vehicles, connected thermostats, among others. The computing devices 110 may include any connected device that may download and/or upload data through the network 100. In some examples, the computing devices 110 may include one or more network infrastructure devices 120, such as one or more routers, switches, access points, or the like.

Network infrastructure devices 120 may include distribution devices 122-1 to 122-p (collectively, "the distribution devices 122") and edge devices 124-1 to 124-n (collectively, "the edge devices 124") of the network 100. Datacenter 102, distribution devices 122 and edge devices 124 may represent different layers of a communication network to which each computing device 110 can connect and communicate. Datacenter 102 may correspond to the core layer of network 100 implementing a network fabric, distribution devices 122 may correspond to an intermediate layer (e.g., a "fog" layer) of the network 100, and edge devices 124 may correspond to an edge layer of the network 100. The edge layer may correspond to a geographic boundary of the network 100. The intermediate layer may represent one or more devices configured to uplink the core layer and link down the edge layer. The intermediate layer may function to bridge the core layer and the edge layer, aggregating data flows from the edge layer and forwarding the information to the core layer. In FIG. 1, distribution devices 122 may aggregate data flow from edge devices 124 to datacenter 102. An example of a distribution device 122 may comprise a switch, hub, router, bridge, gateway, or other network infrastructure devices configured to connect the core layer with the edge layer in the network 100. In some examples, one or more distribution devices 122 may be directly connected to one or more servers of the datacenter 102, while in some examples one or more distribution devices 122 may be connected to a core layer switch, which is a high capacity switch positioned between the datacenter 102 or other devices of the core layer and the rest of the network 100.

As discussed above, edge devices 124 may be positioned at a geographic edge of the network 100. Edge devices 124 may provide a point of access for end user devices 112 to connect to the network 100, and may be the only devices of the network 100 that directly interact with the end user devices 112. Edge devices 124 may include a switch, hub, router, bridge, gateway, or other networking devices configured to connect the end user devices 112 with the network 100 and to communicate with the distribution devices 122.

Figure 2:
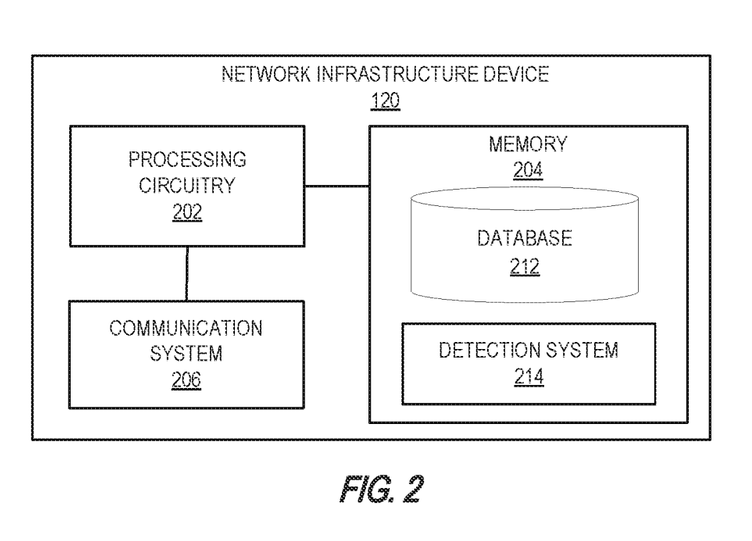
FIG. 2 is an example block diagram illustrating a network infrastructure device including a detection system for detecting an anomaly in the network of FIG. 1.

FIG. 2 is an example block diagram illustrating a network infrastructure device 120 that may be utilized in the network 100 of FIG. 1. As shown in FIG. 2, the network infrastructure device 120 includes a processing circuitry 202 communicatively coupled to a memory 204 and a communication system 206. The memory 204 includes a database 212 and a detection system 214. The detection system 214 may detect an anomaly in the network 100. Memory 204 may be a storage device that may store information and instructions that may be executed by processing circuitry 202. For example, memory 204 is a non-transitory, computer-readable medium including instructions that, when executed by processing circuitry 202, cause network infrastructure device 120 to undertake certain actions.

The communication system 206 may send and receive data over the network 100 as network infrastructure device 120 operates. For example, communication system 206 may send and receive data as the network infrastructure device 120 performs functionalities of a switch, router, an access point or the like. Data sent and received by the communication system 206 may form the network traffic observed by network infrastructure device 120.

The network infrastructure device 120 may track at least a part of network traffic within the network 100 and store the tracked network traffic in the database 212. While tracking network traffic to and from one or more end user devices 112 (e.g., end user device 112-1) that are coupled to the network infrastructure device 120, the network infrastructure device 120 may track the network traffic continuously over a predetermined period of time, and divide the tracked network traffic into several samples in respective time intervals during which the network infrastructure device 120 observes the network traffic. The predetermined period of time may be in hours, days, weeks or months. The time intervals may be preconfigured depending on the predetermined period of time, the network traffic and applications. Time intervals may be in seconds, minutes, or hours. Examples of time intervals may include 30 seconds time intervals, five minutes time intervals, fifteen minutes time intervals, thirty minutes time intervals, and the like. In an example, if the network infrastructure device 120 segments the network traffic that is tracked over an hour into fifteen minutes time intervals, the network infrastructure device 120 may group network traffic that is tracked during the first fifteen minutes into a first time interval, network traffic that is tracked during the second fifteen minutes into a second time interval, network traffic that is tracked during the third fifteen minutes into a third time interval, and network traffic that is tracked during the fourth fifteen minutes into a fourth time interval. Accordingly, the network infrastructure device 120 may track four samples over an hour. Further, network infrastructure device 120 may track network traffic periodically or continuously for a plurality of predetermined periods of time as network infrastructure device 120 operates.

Tracking network traffic within the network 100 may include tracking packets being sent and received within the network 100. The network infrastructure device 120 tracks via the communication system 206 packets in the network traffic as it performs its functionality of network switching or routing. For example, the network infrastructure device 120 may track packets sent and received by the end user device(s) 112 or packets that are forwarded from the end user device(s) 112.

As part of tracking the network traffic, the network infrastructure device 120 may monitor packets observed by the network infrastructure device 120 based on their packet length values. A packet length value of a packet is the data size of the packet in bytes. Because packets in the network traffic may be of a variety of different data sizes depending on types of applications such as email, skype, web browsing etc., the network infrastructure device 120 may observe packets of different packet length values. Packet length values of the packets may range from about 64 byte to about 1500 bytes. The network infrastructure device 120 may track several packet length values for several packets in a time interval. Each packet length corresponds to a packet of the packets being tracked by the network infrastructure device 120 via the communication system 206. Further, the network infrastructure device 120 may track different counts of packet length values in different time intervals.

In some examples, the network infrastructure device 120 segregates the packet length values of the tracked samples into a plurality of sets of packet length values for a plurality of sequences of packets associated with a plurality of traffic flows in which the network infrastructure device 120 observes the packets. A traffic flow is a sequence of packets that have some field values in common. These common field values can include source IP address, destination IP address, source port, destination port, and IP protocol type (referred to as the "5-tuple"). In certain examples, if the network infrastructure device 120 segregates each of four samples tracked over an hour in five different traffic flows, the network infrastructure device 120 may store twenty sets of packet length values for twenty sequences of packets over an hour. Once the plurality of sets of packet length values for each of the traffic flows is segregated, the network infrastructure device 120 stores them in the database 212.

The detection system 214 may determine a set of packet length values for a selected sequence of packets associated with a traffic flow from the database 212. In an example, the detection system 214 may receive a plurality of sets of packet length values for a plurality of selected sequences of packets associated with the plurality of traffic flows from the database 212. As described above, each set of packet length values includes packet length values of a selected sequence of packets observed by network infrastructure device 120, in a traffic flow.

Once the set of packet length values is determined, the detection system 214 may generate a dictionary based on the set of packet length values. In an example, the detection system 214 applies LZW compression algorithm on the set of packet length values to generate the dictionary.

LZW compression algorithm is a lossless compression algorithm in which no data is lost, and original data can be entirely reconstructed from an encoded message file. LZW compression works by reading a sequence of characters of data, grouping the characters into strings, and converting the strings into codes. The algorithm inserts two or more successive characters from the sequence, with an overlapping character, as distinct elements (i.e., dictionary elements) and encode them to form a dictionary or a codebook. The last character of each dictionary element is the first character of the next dictionary element. Compression is achieved by using codes 256 through 4095 to represent dictionary elements. As the encoding continues, LZW compression algorithm recognizes repeated sequences in the data and add them to the dictionary. Decoding is achieved by taking codes from the compressed file and translating it using the dictionary to find what character(s) it represents.

Upon applying the LZW compression algorithm on the determined set of packet length values, a dictionary is generated for the set of packet length values. The dictionary may include distinct successive dictionary elements generated by grouping two or more successive packet length values with an overlapping packet length. The distinct dictionary elements may be encoded using codes (that are referred to as 'keys' herein) beginning from, for example, 256. Accordingly, a set of keys is generated for the set of packet length values. Each key of the set of keys represents a distinct dictionary element, in the dictionary, that includes two or more successive packet length values from the set of packet length values. Table 1 shows an example dictionary generated by LZW compression algorithm. The example dictionary includes a set of keys representing distinct dictionary elements generated from an example set of packet length values (70, 85, 70, 70, 85, 85, 105). In this example, a first key (e.g., 256) of the set of keys represents a first dictionary element including first two successive packet length values (i.e., 70, 85), a second key represents a second dictionary element including two successive packet length values (i.e., 85, 70) with an overlapping packet length from the first dictionary element, a third key represents a third dictionary element including two successive packet length values (e.g., 70, 70) with an overlapping packet length from the second dictionary element, a fourth key represents a fourth dictionary element including three successive packet length values (70, 85, 85) with an overlapping packet length from the third dictionary element, and a fifth key represents a fifth dictionary element including two successive packet length values (e.g., 85, 105) with an overlapping packet length from the fourth dictionary element.

TABLE 1

| Example Dictionary | | | | | |
|---|---|---|---|---|---|
| Dictionary elements | 70, 85 | 85, 70 | 70, 70 | 70, 85, 85 | 85, 105 |
| Set of Keys | 256 | 257 | 258 | 259 | 260 |

Once the dictionary is generated for the set of packet length values, the detection system 214 may determine a set of statistical features of the dictionary. The set of statistical features of the dictionary may be determined based on the set of keys of the dictionary. The set of statistical features of the dictionary may include a count of keys in the set of keys, a key length-based statistical feature of the set of keys, and a unique key length-based statistical feature of the set of keys.

The key length-based statistical feature of the dictionary is based on key lengths of the keys in the set of keys of the dictionary. A key length of a key refers to a count of packet length values in a corresponding dictionary element that is represented by that key in the dictionary. For example, a key length of a given key is two if the corresponding dictionary element includes two packet length values and a key length of another key is four if a corresponding dictionary element includes four packet length values. The key length-based statistical feature of the dictionary may include a mean of the key lengths, a maximum key length, a minimum key length or a standard deviation of key lengths in the set of keys of the dictionary.

The unique key length-based statistical feature of the dictionary is based on unique key lengths of the keys in the set of keys of the dictionary. A unique key length of a key refers to a count of packet length values that are unique in a corresponding dictionary element that is represented by that key in the dictionary. In other words, a unique packet length value refers to a packet length value in a dictionary element that does not repeat in that dictionary element. For example, a unique key length of a given key representing a dictionary element (70, 85) is two because both the packet length values in the dictionary element (70, 85) are unique. In another example, a unique key length of another given key representing a dictionary element (70, 70) is one because the dictionary element includes one unique packet length (i.e., 70). The unique key length-based statistical features of the dictionary may include a mean of the unique key lengths, a maximum unique key length, a minimum unique key length or a standard deviation of unique key lengths in the set of keys.

In some examples, the detection system 214 may determine a set of nine statistical features of the dictionary based on the set of keys of the dictionary generated for the determined set of packet length values. The nine statistical features include the count of keys in the dictionary, the mean of the key lengths, the maximum key length, the minimum key length, the standard deviation of key lengths, the mean of the unique key lengths, the maximum unique key length, the minimum unique key length and the standard deviation of unique key lengths.

In some examples, the detection system 214 may determine a plurality of sets of statistical features for a plurality of sets of packet length values that have been determined for a plurality of selected sequences of packets associated with a plurality of traffic flows from the database 212.

Once the plurality of sets of statistical features are determined, the detection system 214 may determine, using a machine learning algorithm, a plurality of sets of aggregated set of statistical features based on the plurality of sets of statistical features during a training phase. The machine learning algorithm may be executed on the detection system 214 or a computing system present, as a service, in the network 100 or a cloud system coupled to the network 100, A computing system present in a cloud system may be referred to as a cloud computing system. The detection system 214 may transmit the multiple sets of statistical features to the computing system and receive a result of the machine learning algorithm including the aggregated set of statistical features from the computing system.

In an example, a portion of the plurality of sets of statistical features may be derived from the plurality of sets of statistical features for the machine learning algorithm. The portion of the plurality of sets of statistical features is utilized as training data for the machine learning algorithm and the remaining portion of the plurality of sets of statistical features is utilized as testing data for the machine learning algorithm. For example, 80% of the plurality of sets of statistical features is utilized as training data for the machine learning algorithm and the remaining 20% of the plurality of sets of statistical features is utilized as testing data for the machine learning algorithm.

In an example, the machine learning algorithm is an unsupervised machine learning algorithm such as k-mean clustering algorithm. The k-means clustering algorithm is applied on the plurality of sets of statistical features to generate a plurality of clusters, in a multi-dimensional space, from the plurality of sets of statistical features. By generating the plurality of clusters, each set of statistical features is assigned as a data point, in the multi-dimensional space, to a cluster of the plurality of clusters. In an example, each cluster may correspond to one of the plurality of traffic flows. That is, each cluster may include multiple data points representing multiple sets of statistical features determined for multiple sets of packet length values associated with one of the plurality of traffic flows. In an example, each data point representing a set of statistical features is associated with nine statistical features described above. Further, each cluster is characterized by, in part, a position of a centroid of the cluster. A set of statistical features (e.g., the nine features) associated with a centroid of a cluster may be referred to as an aggregated set of statistical features. According, a plurality of aggregated sets of statistical features may be determined corresponding to the plurality of clusters. Further, distances of the data points in a cluster from the centroid of the cluster may define the distribution of the data points within the cluster.

Table 2 shows three aggregated sets of nine statistical features, individually, for three example clusters.

TABLE 2

Aggregated sets of statistical features for three example lusters

| | | Clusters | | |
|---|---|---|---|---|
| | | Cluster 1 | Cluster 2 | Cluster 3 |
| | Count of keys in Dictionary | 8606 | 5184 | 2145 |
| Key Length-based Statistical Features | Mean Key Length | 9.67 | 7.07 | 11.95 |
| | Std. Dev. Of Key Lengths | 5.122 | 6.67 | 7.285 |
| | Maximum Key Length | 31 | 47 | 32 |
| | Minimum Key Lengths | 1 | 1 | |
| Unique Key Length-based Statistical Features | Mean Unique Key Length | 5.76 | 4.06 | 234 |
| | Std. Dev. Of Unique Key Lengths | 2.968 | 1.669 | 1.07 |
| | Maximum Unique Key Length | 14 | 12 | 7 |
| | Minimum Unique Key length | 1 | 1 | 1 |

Determining aggregated set of statistical features, using a machine learning algorithm, may help in gauging trends of the plurality of traffic flows observed by the network infrastructure device 120 in the network 100. For example, the detection system 214 may receive different sets of packet length values in different time intervals such as working hours or non-working hours in an office and determine trends of the traffic flows in those periods of time. Identifying any change in the trend of a traffic flow in a given period of time may be detected as an anomaly in the traffic flow.

In some examples, the detection system 214 may determine another set of packet length values from the database 212. In an example, the other set of packet length values is a set of packet length values for another selected sequence of packets associated with one of the plurality of traffic flows observed by the network infrastructure device 120 on a real-time basis. The detection system 214 may generate, using the LZW compression algorithm, another dictionary for the other set of packet length values and determine another set of statistical features of the other dictionary generated for the other set of packet length values, as described above.

As an example, the detection system 214 generates, using the LZW compression algorithm, the other dictionary including another set of keys based on the other set of packet length values and determine the other set of statistical features for the other dictionary, based on the other set of keys. The other set of statistical features may include the nine statistical features, of the other dictionary, including a count of keys, a mean of key lengths, a maximum key length, a minimum key length, a standard deviation of key lengths, a mean of the unique key lengths, a maximum unique key length, a minimum unique key length and a standard deviation of unique key lengths based on the other set of keys.

Once the other set of statistical features for the other set of packet length values is determined, the detection system 214 compares the other set of statistical features with each aggregated set of baseline features for the plurality of clusters determined during the training phase. In some examples, a variation in the other set of statistical features from an aggregated set of statistical features may be determined based on a distance of another data point representing the other set of statistical features, in the multi-dimensional space, from a centroid of a cluster to which the aggregated set of statistical features is associated to. Various standard mechanisms may be used to determine distance between the other data point and the centroid of the cluster. In an example, the detection system 214 determines whether the other data point representing the other set of packet length values is within or outside of a duster to determine whether the other set of statistical features varies from the aggregated set of statistical features of that duster. When the other data point is outside the duster, the other set of statistical features for the other set of packet length values varies from the aggregated set of statistical features. When the other data point is within the duster, the other set of statistical features for the other set of packet length values does not vary from the aggregated set of statistical features.

In some examples, depending on the deployment, the detection system 214 may determine how many statistical features of the other set of statistical features vary from the respective statistical features of the aggregated set of statistical features while comparing. In particular, the detection system 214 may determine how many statistical features out of nine statistical features of the other set of statistical features vary as compared to the respective nine statistical features of the aggregated set. Based on the comparison, detection system 214 may compute a change metric between the other set of statistical features for the other set of packet length values and the aggregated set of statistical features. A change metric refers to a count of statistical features, in a given set of statistical features determined for a given set of packet length values, that have substantially varied from respective statistical features of an aggregated set of statistical features. As used herein, the term "substantially varied" or "substantially vary" may mean that a variation in a statistical feature of a set of statistical features to a corresponding statistical feature of an aggregated set of statistical features is more than a threshold value for that statistical feature that may be set by an administrator. The change metric may be zero when none of the statistical features of a given set of statistical features has substantially varied from respective statistical features of an aggregated set of statistical features. The change metric may increase by a value for each statistical feature of the given set of statistical features that has substantially varied from a corresponding statistical feature of the aggregated set of statistical features. For example, when it is determined that five statistical features out of nine statistical features for the other set of statistical features have substantially varied from the respective five statistical features of an aggregated set of statistical features, a change metric between the other set of statistical features and the aggregated set of statistical features is five. In some examples, a change metric between the other set of statistical features and each of the plurality of aggregated set of statistical features may be determined.

The change metric between the other set of statistical features and an aggregated set of statistical features may be compared with a threshold change metric. The threshold change metric is a change metric predefined by an administrator to set a criteria to detect an anomaly in a traffic flow. On comparing the change metric and the threshold change metric, the detection system 214 may determine whether the change metric is more than the threshold change metric in order to detect an anomaly in the traffic flow the other set of packet length values is associated to. In examples when the change metric is more than the threshold change metric, an anomaly is detected in the traffic flow. In examples when the change metric is not more than the threshold change metric, no anomaly is detected in the traffic flow.

Upon detecting the anomaly in the traffic flow, the detection system 214 may transmit to the administrator an indication that the anomaly has occurred in the traffic flow. In an example, an alert is raised on detection of the anomaly. On receipt of the indication, the administrator may stop the traffic flow to the network infrastructure device 120. In other examples, depending on the anomaly, the administrator may perform an action to improve a feature related to the network 100 to address the anomaly. A feature related to the network 100 may include security of the network, reconfiguration of the network, or redesign of the network to accommodate a new traffic flow. In some examples, the administrator may instruct a network infrastructure device (e.g., a network orchestrator) to perform a security action such as send a command to stop the traffic flow to the network infrastructure device 120 when a potential security event occurred at the network 100 to improve the security of the network 100. In some examples when the anomaly occurred due to for example, a new application deployment at a computing device 110, the administrator may instruct a network infrastructure device (e.g., a network orchestrator) to perform an action to manage the traffic flow to the network infrastructure device 120 to improve the management of the network 100. For example, on deploying a new application, an additional traffic flow may be included in the network 100.

The detection system 214 may periodically determine additional sets of packet length values observed by the network infrastructure device 120 in a traffic flow, determine an additional set of statistical features (as described above) for each additional set of packet length values, and compare the additional set of statistical features with the aggregated set(s) of statistical features to detect any anomaly in the traffic flow based on the comparison.

Figure 3:
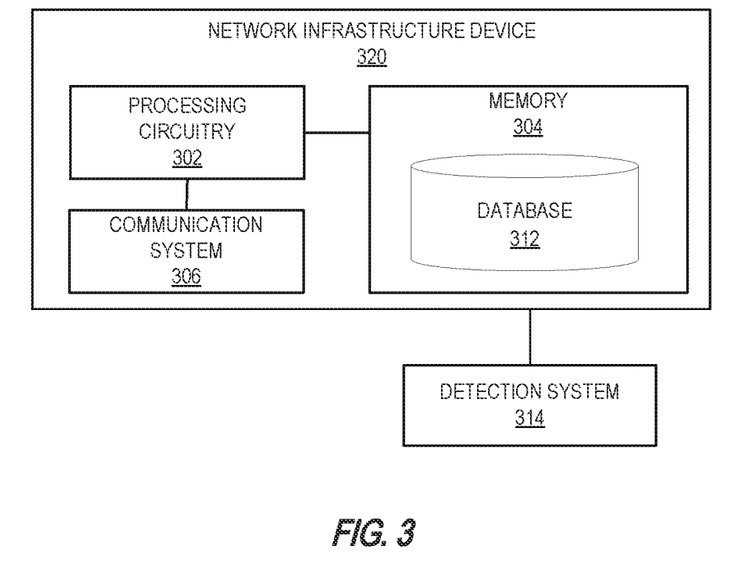
FIG. 3 is another example block diagram illustrating a network infrastructure device coupled to a detection system for detecting an anomaly in the network of FIG. 1.

In some other examples, FIG. 3 illustrates an example data block including a network infrastructure device 320 coupled to a detection system 314, that may be utilized in the network 100 of FIG. 1 for detecting an anomaly. In these examples, the detection system 314 is separate from the network infrastructure device 320. The detection system 314 is similar to the detection system 214 (FIG. 2). The network infrastructure device 320 includes a processing circuitry 302, a memory 304, a communication system 306 and a database 312 which are respectively similar to the processing circuitry 202, memory 204, communication system 206 and database 212 of the network infrastructure device 120. The detection system 314 may be in communication with the network infrastructure device 320 and may receive data from the database 312. In an example, the detection system 314 executes on a computing system present in the network 100 or a cloud system coupled to the network 100.

Figure 4:
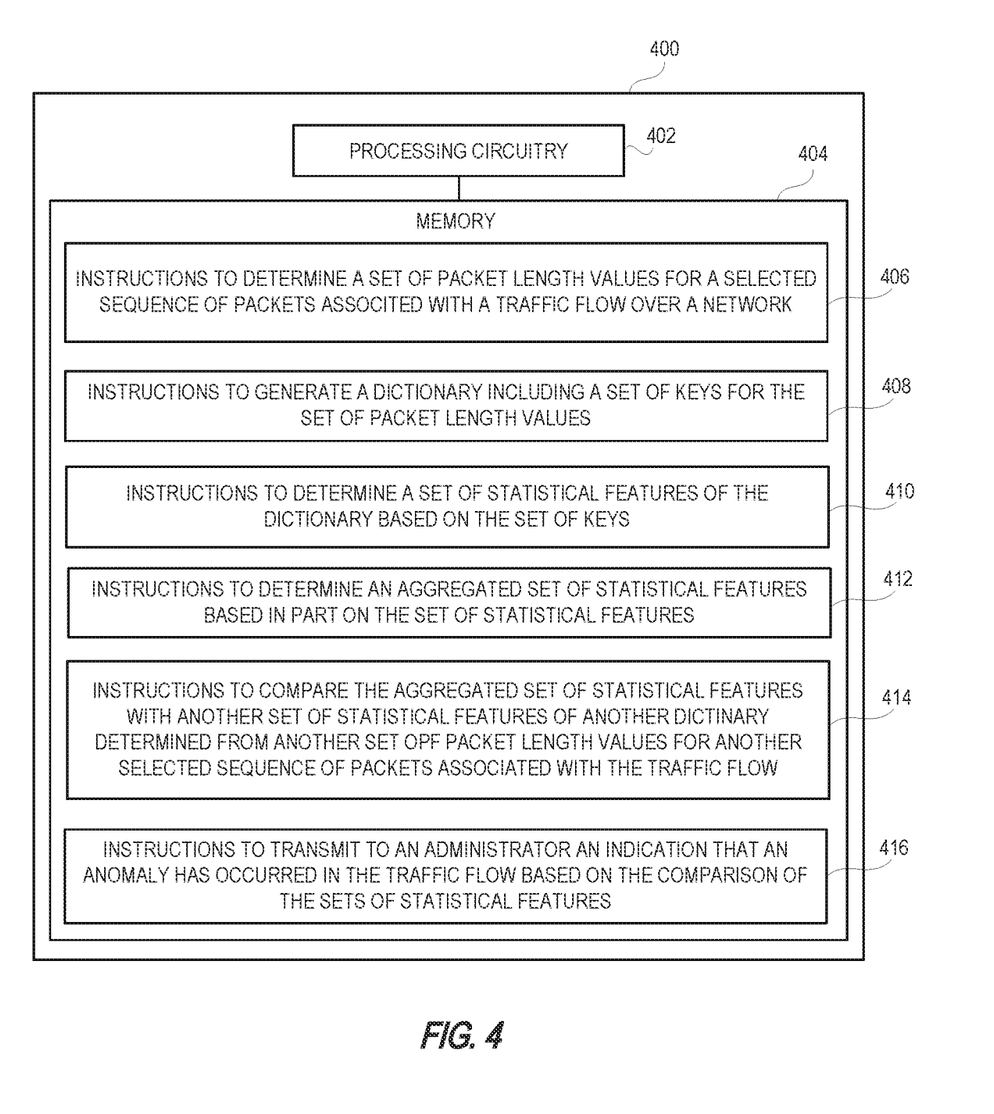
FIG. 4 is an example detection system depicting a processing circuitry and a memory encoded with instructions for detecting an anomaly in a network.

FIG. 4 is a block diagram of an example computing system 400 including a processing circuitry 402 coupled to memory 404. Memory 404 is a non-transitory, computer-readable medium including instructions 406, 408, 410, 412, 414 and 416 (406-416) to detect an anomaly in a network, in accordance with an example. The instructions 406-416 of FIG. 4, when executed by the processing circuitry 402, may implement some or all functions of a detection system (e.g., the detection system 214 of FIG. 2 or the detection system 314 of FIG. 3) for detecting an anomaly in a network. In some examples, the computing system 400 may be included in (e.g., as part of) a network infrastructure device (e.g., network infrastructure device 120 of FIG. 1). In some other examples, the computing system 400 may be present in the network or a cloud system coupled to the network. For ease of illustration, FIG. 4 will be described with reference to FIGS. 1-2. In certain examples; the instructions 406-416 may be executed for performing the functionalities of the detection system 214 or the detection system 314 and a method 500 described in FIG. 5.

Instructions 406 may be executed to determine a set of packet length values for a selected sequence of packets associated with a traffic flow over the network 100. The set of packet length values may be tracked by the network infrastructure device 120 in the traffic flow in a period of time. The set of packet length values may be determined from the database 212.

Instructions 408 may be executed to generate a dictionary including a set of keys for the set of packet length values. In the examples described herein; the dictionary is generated by applying LZW compression algorithm on the set of packet length values. The set of keys of the dictionary may represent a combination of two or more successive packet length values from the set of packet length values.

Instructions 410 may be executed to determine a set of statistical features of the dictionary based on the set of keys. As described previously, the set of statistical features includes nine statistical features based on the set of keys. The nine statistical features may include the count of keys in the dictionary, a mean key length, a maximum key length, a minimum key length, a standard deviation of key lengths, a mean unique key length, a maximum unique key length, a minimum unique key length and a standard deviation of unique key lengths.

Instructions 412 may be executed to determine an aggregated set of statistical features based in part on the set of statistical features. An unsupervised machine learning algorithm may be utilized to determine the aggregated set of statistical features. In an example; the unsupervised machine learning algorithm is k-mean clustering algorithm. As described previously, in some examples, the unsupervised machine learning algorithm may be applied to a plurality of sets of statistical features determined for a plurality of selected sequences of packets to generate a plurality of clusters and thereby determine a plurality of aggregated sets of statistical features.

Instructions 414 may be executed to compare each aggregated set of statistical features with another set of statistical features. The other set of statistical features is determined for another dictionary, including another set of keys, generated for another set of packet length values. The other set of packet length values is determined for another sequence of packets associated with the traffic flow. The other set of statistical features is determined in the same fashion as the previous set of statistical features has been determined during the training phase. The other set of statistical features may include the nine statistical features (as described previously) for the other dictionary based on the other set of keys. In some examples, a change metric is determined between the other set of statistical features and each aggregated set of statistical features based on the comparison. Further, it may be determined whether the change metric is more than a threshold change metric in order to detect an anomaly in the traffic flow.

Instructions 416 may be executed to transmit to an administrator an indication that an anomaly has occurred based on the comparison. In an example, an alert is raised on detection of an anomaly.

Additional instructions may be executed to perform an action to improve a feature of the network upon detecting the anomaly. In an example, additional instructions may be executed to perform a security action or an action to improve the management of the network 100.

The instructions 406-416 may include various instructions to execute at least a part of the method described in FIG. 5 (described below). Also, although not shown in FIG. 4, the memory 404 may also include additional program instructions to perform various other method blocks described in FIG. 5.

Figure 5:
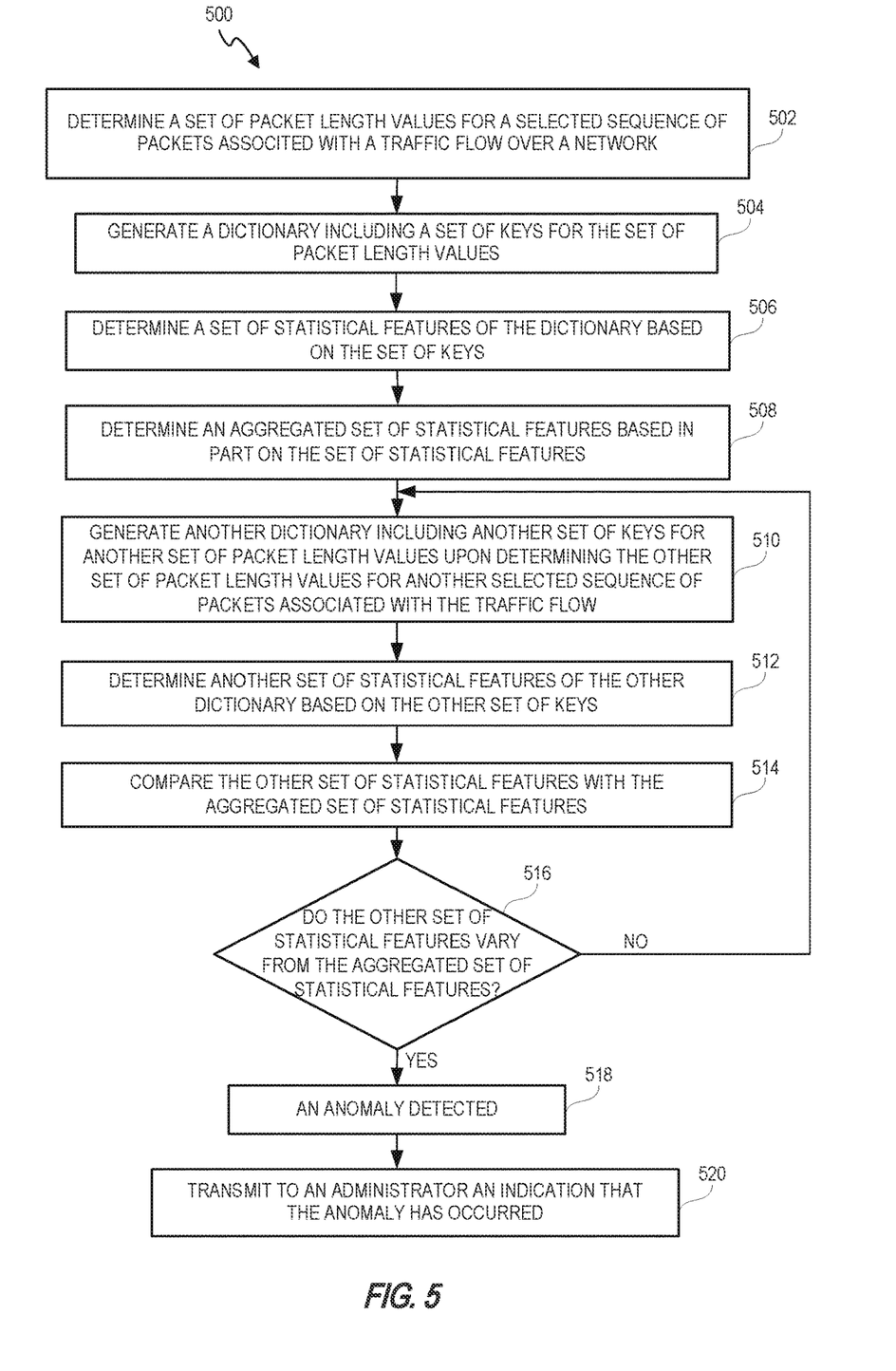
FIG. 5 is a flowchart illustrating an example method for detecting an anomaly in a network.

FIG. 5 is a flowchart illustrating an example method 500 for detecting an anomaly in a network. Method 500 may, for example; be executed by a service provided from network infrastructure devices or cloud computing systems. Additionally, implementation of method 500 is not limited to such examples. Although the flowchart of FIG. 5 shows a specific order of performance of certain functionalities, method 500 is not limited to such order. For example, the functionalities shown in succession in the flowchart may be performed in a different order, may be executed concurrently or with partial concurrence, or a combination thereof.

In block 502, a set of packet length values for a selected sequence of packets associated with a traffic flow over the network 100 is determined by a detection system. The set of packet length values may be tracked by the network infrastructure device 120 in the traffic flow in a period of time. The set of packet length values may be determined from the database 212.

In block 504, a dictionary is generated for the set of packet length values. The dictionary includes a set of keys that is determined based on the set of packet length values. As described previously, the dictionary is generated using LZW compression algorithm on the set of packet length values. The set of keys of the dictionary may represent a combination of two or more successive packet length values from the set of packet length values.

In block 506, a set of statistical features of the dictionary is determined based on the set of keys. As described previously, the set of statistical features for the dictionary includes a count of keys, a key length-based statistical feature and a unique key length-based statistical feature, as described previously. In certain examples, the set of statistical features for the dictionary includes nine statistical features of the dictionary. The nine statistical features may include the count of keys in the dictionary, a mean key length, a maximum key length, a minimum key length, a standard deviation of key lengths, a mean unique key length, a maximum unique key length, a minimum unique key length and a standard deviation of unique key lengths.

In some examples, a plurality of sets of packet length values for a plurality of selected sequences of packets associated with the traffic flow may be determined. In these examples, a dictionary for each of the plurality of sets of packet length values is generated, and a set of statistical features for each dictionary is determined.

In block 508, a machine learning algorithm may be applied to a plurality of sets of statistical features determined for a plurality of dictionaries generated for the plurality of sets of packet length values. In an example, is an unsupervised machine learning algorithm such as k-mean clustering algorithm. Upon applying k-means clustering algorithm on the plurality of sets of statistical features, a plurality of clusters is generated and thereby a plurality of an aggregated sets of statistical features is determined. Each aggregated set of statistical features includes nine statistical features.

In block 510, upon determining another set of packet length values for another selected sequence of packets associated with a traffic flow, another dictionary for the other set of packet length values is generated. The other set of set of packet length values may be determined on real-time basis. The other dictionary includes another set of keys based on the other set of packet length values. The other dictionary is determined using LZW compression algorithm.

In block 512, another set of statistical features for the other dictionary is determined. The other set of statistical features for the other dictionary is determined based on the other set of keys in the similar fashion as described above for a dictionary during the training phase. The other set of statistical features may include nine statistical features (as described previously) for the other dictionary.

In block 514, the other set of statistical features is compared with an aggregated set of statistical features. In some examples, the other set of statistical features is compared with each of the plurality of aggregated sets of statistical features. In some examples, a change metric (described previously) is computed between the other set of statistical features and each aggregated set of statistical features, and then determined whether the change metric is more than a threshold change metric.

In some examples, when a change metric between the other set of statistical features and an aggregated set of statistical features is more than the threshold change metric, it is determined that the other set of statistical features vary with the aggregated set of statistical features (YES' at block 516). In these instances, at block 518, an anomaly is detected in the traffic flow to which the other set of packet length values is associated. The method then proceeds to block 520.

At block 520, an indication that the anomaly has occurred in the traffic flow is transmitted to an administrator. In an example, the indication includes an alert, to the administrator, raised on the detection of the anomaly. In response to the indication, an action is performed to improve a feature related to the network 100 to address the anomaly. A feature related to the network may include security of the network, reconfiguration of the network, or redesign of the network to accommodate a new traffic flow. In some examples, a security action may be taken to improve security of the network 100. For example, a traffic flow to the network infrastructure device 120 may be stopped to prevent or avoid any security attack that may be caused due to the detected anomaly. In some other examples, an action to improve the management of the network 100 may be performed.

In some examples, when the change metric between the other set of features and each aggregated set of statistical features is not more than the threshold change metric, it is determined that the other set of statistical features does not vary with any of the aggregated sets of statistical features (NO' at block 516). In these instances, no anomaly is detected in the traffic flow. In some examples, additional sets of packet length values may be determined, periodically, and blocks 510, 512 and 514 may be iterated to detect any anomaly in the traffic flow.

A detection system is a processor-based system or a service (e.g., instructions stored in a non-transitory, computer-readable medium and executed by processing circuitry) executed on a computing system that detects an anomaly in a network. In some examples, the detection system executes on a network infrastructure device such as a switch or a network orchestrator in the network. In some other examples, the detection system executes on a cloud computing system.

An administrator is a person, network service, or combination thereof that has administrative access to network components (e.g., network infrastructure devices) and configures the network components.

Processing circuitry is circuitry that receives instructions and data and executes the instructions. Processing circuitry may include application specific integrated circuits (ASICs), field programmable gate arrays (FPGAs), microcontrollers, central processing units (CPUs), graphics processing units (GPUs), microprocessors, or any other appropriate circuitry capable of receiving instructions and data and executing the instructions. Processing circuitry may include one processor or multiple processors. Processing circuitry may include caches. Processing circuitry may interface with other components of a device, including memory, network interfaces, peripheral devices, supporting circuitry, data buses, or any other appropriate component. Processors of a processing circuitry may communicate to one another through shared cache, interprocessor communication, or any other appropriate technology.

Memory is one or more non-transitory computer-readable medium capable of storing instructions and data. Memory may include random access memory (RAM), read only memory (ROM), processing circuitry cache, removable media (e.g. CD-ROM, USB Flash Drive), storage drives (e.g. hard drive (HDD), solid state drive (SSD)), network storage (e.g. network attached storage (NAS)), and/or cloud storage. In this disclosure, unless otherwise specified, all references to memory, and to instructions and data stored in memory, can refer to instructions and data stored in any non-transitory computer-readable medium capable of storing instructions and data or any combination of such non-transitory computer-readable media.

The features of the present disclosure can be implemented using a variety of specific devices that contain a variety of different technologies and characteristics. As an example, features that include instructions to be executed by processing circuitry may store the instructions in a cache of the processing circuitry, in random access memory (RAM), in hard drive, in a removable drive (e.g. CD-ROM), in a field programmable gate array (FPGA), in read only memory (ROM), or in any other non-transitory, computer-readable medium, as is appropriate to the specific device and the specific example implementation. As would be clear to a person having ordinary skill in the art, the features of the present disclosure are not altered by the technology, whether known or as yet unknown, and the characteristics of specific devices the features are implemented on. Any modifications or alterations that would be required to implement the features of the present disclosure on a specific device or in a specific example would be obvious to a person having ordinary skill in the relevant art.

Although the present disclosure has been described in detail, it should be understood that various changes, substitutions and alterations can be made without departing from the spirit and scope of the disclosure. Any use of the words "may" or "can" in respect to features of the disclosure indicates that certain examples include the feature and certain other examples do not include the feature, as is appropriate given the context. Any use of the words "or" and "and" in respect to features of the disclosure indicates that examples can contain any combination of the listed features, as is appropriate given the context.

Phrases and parentheticals beginning with "e.g." or "i.e." are used to provide examples merely for the purpose of clarity. It is not intended that the disclosure be limited by the examples provided in these phrases and parentheticals. The scope and understanding of this disclosure may include certain examples that are not disclosed in such phrases and parentheticals.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

We claim:

1. A processor-based detection system comprising:
a processing circuitry; and
a memory communicatively coupled to the processing circuitry and including instructions that, when executed by the processing circuitry, cause the detection system to: determine a set of packet length values for a selected sequence of packets associated with a traffic flow over a network;
generate a dictionary including a set of keys for the set of packet length values, wherein each key represents a combination of two or more successive packet length values from the set of packet length values;
determine a set of statistical features of the dictionary based on the set of keys, wherein the set of statistical features comprises a count of keys in the set of keys, a key length-based statistical feature and a unique key length-based statistical feature;
determine, using a machine learning algorithm, an aggregated set of statistical features based in part on the set of statistical features;
compare the aggregated set of statistical features with another set of statistical features, of another dictionary, determined from another set of packet length values for another selected sequence of packets associated with the traffic flow;
based on the comparison of the sets of statistical features, transmit to an administrator an indication that an anomaly has occurred in the traffic flow; and
wherein the dictionary is generated using Lempel-Ziv-Welch (LZW) compression algorithm from the set of packet length values.

2. The detection system of claim 1, wherein the key length-based statistical feature is determined based on key lengths of the keys in the set of keys, and wherein a key length of each key is a count of packet length values in the combination of two or more successive packet length values represented by that key.

3. The detection system of claim 2, wherein the key length-based statistical feature comprises a mean key length, a maximum key length, a minimum key length or a standard deviation of the key lengths.

4. The detection system of claim 1, wherein the unique key length-based statistical feature is determined based on unique key lengths of the keys in the set of keys, and wherein a unique key length of each key is a count of packet length values that are unique in the combination of two or more successive packet length values represented by that key.

5. The detection system of claim 4, wherein the unique key length-based statistical feature comprises a mean unique key length, a maximum unique key length, a minimum unique key length or a standard deviation of the unique key lengths.

6. The detection system of claim 1, wherein the machine learning algorithm is an unsupervised machine learning algorithm.

7. The detection system of claim 1, wherein the memory comprises further instructions that, when executed by the processing circuitry, cause the detection system to:
upon determining the other set of packet length values, generate the other dictionary including another set of keys for the other set of packet length values, wherein each key represents a combination of two or more successive packet length values from the other set of packet length values; and
determine the other set of statistical features of the other dictionary based on the other set of keys, wherein the other set of statistical features comprises a count of keys in the other set of keys, a key length-based statistical feature and a unique key length-based statistical feature.

8. The detection system of claim 1, wherein the instructions to compare comprise instructions to cause the processing circuitry to:
compute a change metric between the sets of statistical features based on the comparison; and
determine whether the change metric is more than a threshold change metric.

9. The detection system of claim 1, wherein the detection system is present in the network or a cloud system coupled to the network.

10. A non-transitory, computer-readable medium including instructions that, when executed, cause a device to:
determine a set of packet length values for a selected sequence of packets associated with a traffic flow over a network;
generate a dictionary including a set of keys for the set of packet length values, wherein each key represents a combination of two or more successive packet length values from the set of packet length values;
determine a set of statistical features of the dictionary based on the set of keys, wherein the set of statistical features comprises a count of keys in the set of keys, a key length-based statistical feature and a unique key length-based statistical feature;
determine, using a machine learning algorithm, an aggregated set of statistical features based in part on the set of statistical features;
upon determining another set of packet length values for another selected sequence of packets associated with the traffic flow, generate another dictionary including another set of keys for the other set of packet length values, wherein each key represents a combination of two or more successive packet length values from the other set of packet length values;

determine another set of statistical features of the other dictionary based on the other set of keys, wherein the other set of statistical features comprises a count of keys in the other set of keys, a key length-based statistical feature and a unique key length-based statistical feature;

compare the other set of statistical features with the aggregated set of statistical features;

based on the comparison of the sets of statistical features, transmit to an administrator an indication that an anomaly has occurred in the traffic flow; and wherein the dictionary is generated using Lempel-Ziv-Welch (LZW) compression algorithm from the set of packet length values.

11. A method comprising:

determining, by a network infrastructure device, a set of packet length values for a selected sequence of packets associated with a traffic flow over a network;

generating, by the network infrastructure device, a dictionary including a set of keys for the set of packet length values, wherein each key represents a combination of two or more successive packet length values from the set of packet length values;

determining, by the network infrastructure device, a set of statistical features of the dictionary based on the set of keys, wherein the set of statistical features comprises a count of keys in the set of keys, a key length-based statistical feature and a unique key length-based statistical feature;

determining, by the network infrastructure device and using a machine learning algorithm, an aggregated set of statistical features based in part on the set of statistical features;

upon determining another set of packet length values for another selected sequence of packets associated with the traffic flow, generating, by the detection system, another dictionary including another set of keys for the other set of packet length values, wherein each key represents a combination of two or more successive packet length values from the other set of packet length values;

comparing, by the detection system, the other set of statistical features with the aggregated set of statistical features;

based on the comparison of the sets of statistical features, transmit to an administrator, by the detection system, an indication that an anomaly has occurred in the traffic flow; and wherein the dictionary is generated using Lempel-Ziv-Welch (LZW) compression algorithm from the set of packet length values.

12. The method of claim 11, wherein the key length-based statistical feature is determined based on key lengths of the keys in the set of keys, and wherein a key length of each key is a count of packet length values in the combination of two or more successive packet length values represented by that key.

13. The method of claim 12, wherein the key length-based statistical feature comprises a mean key length, a maximum key length, a minimum key length or a standard deviation of the key lengths.

14. The method of claim 11, wherein the unique key length-based statistical feature is determined based on unique key lengths of the keys in the set of keys, and wherein a unique key length of each key is a count of packet length values that are unique in the combination of two or more successive packet length values represented by that key.

15. The method of claim 14, wherein the unique key length-based statistical feature comprises a mean unique key length, a maximum unique key length, a minimum unique key length or a standard deviation of the unique key lengths.

16. The method of claim 11, wherein the machine learning algorithm is an unsupervised machine learning algorithm.

17. The method of claim 11, wherein the comparing comprises:

computing a change metric between the sets of statistical features based on the comparison; and determining whether the change metric is more than a threshold change metric.

18. The method of claim 17, wherein the change metric is a count of statistical features, in the other set of statistical features that substantially vary from the corresponding statistical features of the aggregated set of statistical features.

* * * * *